United States Patent
Fujikata et al.

[11] Patent Number: 6,063,491
[45] Date of Patent: May 16, 2000

[54] MAGNETORESISTANCE EFFECTS FILM

[75] Inventors: Jun-Ichi Fujikata; Kazuhiko Hayashi; Hidefumi Yamamoto; Kunihiko Ishihara, all of Tokyo, Japan

[73] Assignee: NEC Corporation, Tokyo, Japan

[21] Appl. No.: 09/038,093

[22] Filed: Mar. 11, 1998

Related U.S. Application Data

[62] Division of application No. 08/593,689, Jan. 29, 1996, Pat. No. 5,917,400.

[30] Foreign Application Priority Data

Jan. 27, 1996 [JP] Japan ...................................... 7-13354

[51] Int. Cl.$^7$ ........................................................ G11B 5/66
[52] U.S. Cl. ..................... 428/332; 428/336; 428/692; 428/694 R; 428/694 T; 428/694 TM; 428/694 TS; 428/900; 360/113; 338/32 R; 324/252
[58] Field of Search ............................. 428/692, 694 R, 428/694 T, 694 TM, 694 TS, 336, 900, 332; 360/113; 338/32 R; 324/252

[56] References Cited

U.S. PATENT DOCUMENTS

| | | | |
|---|---|---|---|
| 4,103,315 | 7/1978 | Hempstead et al. | 360/113 |
| 5,206,590 | 4/1993 | Dieny et al. | 324/252 |
| 5,304,975 | 4/1994 | Saito et al. | 338/32 R |
| 5,315,282 | 5/1994 | Shinjo et al. | 338/32 R |
| 5,341,261 | 8/1994 | Dieny et al. | 360/113 |
| 5,436,778 | 7/1995 | Lin et al. | 360/113 |
| 5,462,795 | 10/1995 | Shinjo et al. | 428/332 |
| 5,508,866 | 4/1996 | Gill et al. | 360/113 |
| 5,528,440 | 6/1996 | Fontana et al. | 360/113 |
| 5,549,978 | 8/1996 | Iwasaki et al. | 428/692 |
| 5,563,752 | 10/1996 | Komuro et al. | 360/113 |
| 5,917,400 | 6/1999 | Fujikata | 338/32 R |

FOREIGN PATENT DOCUMENTS

| | | |
|---|---|---|
| 0490608 | 6/1992 | European Pat. Off. . |
| 0585009 | 3/1994 | European Pat. Off. . |
| 0594243 | 4/1994 | European Pat. Off. . |
| 0701142 | 3/1996 | European Pat. Off. . |
| 4312040 | 10/1993 | Germany . |
| 4358310 | 12/1992 | Japan . |
| 5347013 | 12/1993 | Japan . |

OTHER PUBLICATIONS

B. Dieny, et al., "Giant magnetoresistance in soft ferromagnetic multilayers," Physical Review, vol. 43, No. 1, Jan. 1, 1991, pp. 1297–1300.

M.J. Carey, et al., "Exchange anisotropy in coupled films of $Ni_{81}Fe_{19}$ with NiO and $Co_xNi_{1-x}O$", App. Phys. Lett., vol. 60, No. 24, pp. 3060–3062, Jun. 15, 1992.

M.J. Carey, et al., "CoO–NiO superlattices: Interlayer interactions and exchange anisotropy with $Ni_{81}Fe_{19}$ (invited)", 931 J. App. Phys. vol. 73, No. 10, pp. 6892–6897, May 15, 1993.

*Primary Examiner*—Leszek Kiliman
*Attorney, Agent, or Firm*—Sughrue, Mion, Zinn, Macpeak & Seas, PLLC

[57] ABSTRACT

The invention provides a magnetoresistance effects film including (a) at least two thin magnetic films deposited on a substrate, (b) at least one thin nonmagnetic film interposed between the thin magnetic films, and (c) a thin antiferromagnetic film disposed adjacent to one of the thin magnetic films between which the thin nonmagnetic film is interposed. A bias magnetic field of one of the thin magnetic films induced by the thin antiferromagnetic film has an intensity Hr greater than a coercivity $H_{C2}$ of the other of the thin magnetic films which is remote from the thin antiferromagnetic film ($Hr > H_{C2}$). The thin antiferromagnetic film has a superlattice structure composed of at least two of NiO, $Ni_xCo_{1-x}O(x=0.1–0.9)$ and CoO. A ratio of Ni relative to Co in the number of atoms in the superlattice structure is set equal to or greater than 1.0. The magnetoresistance effects film exhibits large linear change in resistance with the hysteresis being small even when a small external field is applied thereto.

13 Claims, 5 Drawing Sheets

FIG. 6

MAGNETORESISTANCE EFFECTS FILM

This is a divisional of Application Ser. No. 08/593,689 filed Jan. 29, 1996. now U.S. Pat. No. 5,917,400.

BACKGROUND OF THE INVENTION

1. Field of the Invention

The invention relates to a magnetoresistance effects film to be used for a magnetoresistance effects element for reading out a magnetic field intensity as a signal from magnetic substances such as a magnetic record medium, and more particularly to such a magnetoresistance effects film which exhibits large change in resistance even when a small external magnetic field is applied thereto.

2. Description of the Related Art

Recently, there has been developed the improvement of sensitivity of a magnetic sensor and the densification in magnetic recording, and following such development, there has been also developed a magnetoresistance effects type magnetic sensor (hereinafter, referred to simply as a MR sensor) and a magnetoresistance effects type magnetic head (hereinafter, referred to simply as a MR head). Both of a MR sensor and a MR head read out external magnetic field signals in accordance with changes in a resistance of a reading sensor composed of magnetic material. Both of a MR sensor and a MR head have a characteristic that a relative speed to a magnetically recording medium is not dependent on regenerated outputs. Hence, there can be obtained merits that a MR sensor provides a high sensitivity, and a MR head provides a high output even in high density magnetic recording.

Japanese Unexamined Patent Publication No. 5-347013 laid open to public on Dec. 27, 1993 has suggested a magnetically recording and regenerating apparatus comprising a recording medium for magnetically storing signals therein, and a magnetoresistance effects element comprising a deposited structure composed of a substrate, an antiferromagnetic film, a ferromagnetic film, a nonmagnetic film, a soft magnetic film, a nonmagnetic film, a ferromagnetic film and an antiferromagnetic film, each of which is deposited in a driving direction relative to the recording medium. According to the Publication, there can be obtained a magnetically recording and regenerating apparatus having a high record density and further obtained a magnetoresistance effects element providing high sensitivity and regenerated output.

There has been reported another magnetoresistance effects film in Physical Review B, Vol. 43, No. 1, Jan. 1, 1991, pp 1297–1300, published by The American Physical Society. This magnetoresistance effects film has a structure comprising at least two thin soft magnetic layers separated by a thin nonmagnetic interlayer disposed therebetween. Adjacent to one of the thin soft magnetic layers is disposed a thin antiferromagnetic film to provide an anti-magnetic force thereto to thereby cause rotation of the magnetization with an external magnetic field which is different from that of the other of the thin soft magnetic layers disposed adjacent to the one of the thin soft magnetic layers via the nonmagnetic interlayer. Thus, a change in resistance is caused.

Japanese Unexamined Patent Publication No. 4-358310 laid open to public on Dec. 11, 1992, which is based on U.S. Patent Application Ser. No. 625343 filed on Dec. 11, 1990, now U.S. Pat. No. 5,726,700 has also suggested a similar magnetoresistance effects film. The Publication has disclosed a magnetoresistance sensor utilizing spin-valve effect.

The above mentioned report has suggested, as a practical MR head, a magnetoresistance effect element having a structure comprising a soft magnetic layer, a non-magnetic insulator, a multilayered structure, a non-magnetic insulator and a soft magnetic layer successively deposited in this order.

Though the magnetoresistance effects films suggested in the above identified report and Publication can operate even with a small external magnetic field, it is necessary for them to apply a signal field thereto in a direction of an axis of easy magnetization when it is intended to use the magnetoresistance effects films as a practical MR sensor or MR head. When they are to be used as a magnetic sensor, there has been posed problems that they do not exhibit a change in resistance when a magnetic field has an intensity of approximately zero, and that there would be found nonlinearity such as Barkhausen jump caused due to discontinuous displacement of domain walls.

In addition, it is necessary to use FeMn having inferior corrosion resistance as material of which an antiferromagnetic film is composed. Furthermore, there are another problems that additives have to be added to the antiferromagnetic films in practical use, and a protection film has to be deposited for protecting the magnetoresistance effects films.

On the other hand, if a thin antiferromagnetic film composed of oxide or a thin permanent magnet film both of which has superior corrosion resistance is used as a magnetic film for pinging to a ferromagnetic layer, there arises a problem that a sandwiched film which is to be deposited on the oxide antiferromagnetic film or permanent magnet film and which comprises magnetic layer/nonmagnetic layer/magnetic layer would have poor crystallization, and thus the hysteresis in output is likely to appear.

SUMMARY OF THE INVENTION

It is an object of the present invention to provide a magnetoresistance effects film which exhibits large linear changes in resistance with the hysteresis being small even when a small external magnetic field is applied thereto.

The present invention provides a magnetoresistance effects film including (a) at least two thin magnetic films deposited on a substrate, (b) at least one thin nonmagnetic film interposed between the thin magnetic films, and (c) a thin antiferromagnetic film disposed adjacent to one of the thin magnetic films between which the thin nonmagnetic film is interposed. A bias magnetic field of one of the thin magnetic films induced by the thin antiferromagnetic film has an intensity Hr greater than a coercivity $H_{C2}$ of the other of the thin magnetic films which is remote from the thin antiferromagnetic film ($Hr > H_{C2}$). The antiferromagnetic film has a superlattice structure composed of at least two of NiO, $Ni_xCo_{1-x}O$ (x=0.1–0.9) and CoO. A ratio of Ni relative to Co in the number of atoms in the superlattice structure is designed to be equal to or greater than 1.0.

The present invention further provides a magnetoresistance effects film including (a) at least two thin magnetic films deposited on a substrate, (b) at least one thin nonmagnetic film interposed between the thin magnetic films, and (c) a thin permanent magnet film disposed adjacent to one of the thin magnetic films between which the thin nonmagnetic film is interposed. A coercivity of the thin permanent magnet film has an intensity $H_{ch}$ greater than a coercivity $H_{C2}$ of the other of the thin magnetic films which is remote from the thin permanent magnet film ($H_{ch} > H_{C2}$). The thin permanent magnet film is composed of CoCr, CoCrTa, CoCrTaPt, CoCrPt, CoNiPt, CoNiCr, CoCrPtSi or FeCoCr.

As mentioned above, antiferromagnetic substance of which the thin antiferromagnetic film is composed is selected from NiO, CoO, FeO, $Fe_2O_3$, CrO, MnO, Cr or a combination of those. As an alternative, there may be used a superlattice structure in which at least two types of layers are deposited in turn. The layer is selected from NiO, $Ni_xCo_{1-x}O(x=0.1-0.9)$ or CoO. In addition, by setting a ratio of Ni to Co in the number of atoms in the superlattice structure to be at least 1.0, it is possible to raise a blocking temperature in exchange biased films to be above 100 degrees centigrade. The upper limit of a thickness of the antiferromagnetic film is 1000 angstroms.

On the other hand, there is no lower limit of a thickness of the antiferromagnetic film. However, it is preferable to design the thickness to be at least 100 angstroms in which range superior crystallinity can be obtained, because the crystallinity of an antiferromagnetic superlattice significantly affects the magnitude of a exchange anisotropy field to be applied to a magnetic layer disposed adjacent to the antiferromagnetic superlattice.

In addition, in case that an antiferromagnetic superlattice structure is to be used, a thickness of each of antiferromagnetic layers is preferably equal to or smaller than 50 angstroms. This makes it possible to apply a large exchange bias field to a thin magnetic film disposed adjacent to the antiferromagnetic film, because the interaction occurring at interfaces between the antiferromagnetic films significantly influences the characteristics of the superlattice.

By depositing the films with a temperature of a substrate being arranged in the range of 100 to 300 degrees centigrade, the crystallinity is improved, and hence the magnitude of an exchange bias magnetic field is increased. The film deposition may be carried out through vacuum evaporation, sputtering, molecular beam epitaxy (MBE), and so on. Material of which the substrate is composed may be selected from, for instance, glass, Si, MgO, $Al_2O_3$, GaAs, ferrite, $CaTi_2O_3$, $BaTi_2O_3$, and $Al_2O_3$—Tic.

Magnetic substance of which the thin permanent magnet film to be used in the present invention is composed may be selected from CoCr, CoCrTa, CoCrTaPt, CoCrPt, CoNiPt, CoNiCr, CoCrPtSi or FeCoCr. A underlying layer composed of chromium (Cr) may be disposed between the thin permanent magnet film and a substrate.

In the magnetoresistance effects film in accordance with the present invention, a bcc structured Fe having a thickness in the range of 10 to 60 angstroms is deposited on the thin antiferromagnetic film or the thin permanent magnet film, and a sandwich structure film composed of magnetic layer/nonmagnetic layer/magnetic layer is deposited on the bcc structured Fe. This enhances the crystallinity of the sandwich structure film, and hence lowers hysteresis and noises of outputs to be generated in a magnetoresistance effects element having the sandwich structure film therein.

Magnetic substances of which the thin magnetic film to be used in the invention is composed are not to be limited to any particular ones. For instance, the magnetic substance may be preferably selected from Fe, Ni, Co, Mn, Cr, Dy, Er, Nd, Tb, Tm, Ge or Gd. As an alternative, an alloy or compound including those elements may be used. Such an alloy or compound may be preferably selected from, for instance, Fe—Si, Fe—Ni, Fe—Co, Fe—Gd, Ni—Fe—Co, Ni—Fe—Mo, Fe—Al—Si (Sendust), Fe—Y, Fe—Mn, Cr—Sb, Co family amorphous, Co—Pt, Fe—Al, Fe—C, Mn—Sb, Ni—Mn and ferrite.

In the present invention, a thin magnetic film is made from any one of the above listed magnetic substances. In particular, the magnetoresistance effects film in accordance with the invention can be obtained by selecting a magnetic substance which would cause anisotropic magnetic field $H_{k2}$ of a thin magnetic film disposed not adjacent to the thin antiferromagnetic film or thin permanent magnet film to be greater than the coercivity $H_{c2}$. As an alternative, the magnitude of the anisotropic magnetic field can be increased also by designing the film to be thinner. For instance, it is possible to make the anisotropic magnetic field $H_{k2}$ greater than the coercivity $H_{c2}$ by designing a NiFe layer to have a thickness of about 10 angstroms.

The magnetoresistance effects film in accordance with the present invention can be manufactured by depositing the thin magnetic films in a magnetic field so that an axis of easy magnetization of the thin magnetic film is perpendicular to a direction of a signal magnetic field applied thereto, and further that a coercivity $H_{k2}$ of the thin magnetic film measured in a direction of the applied signal magnetic field is defined by the equation: $H_{c2}<H_{k2}<Hr$. To be concrete, the magnetoresistance effects film in accordance with the invention is manufactured by rotating a magnetic field applied thereto by 90 degrees during deposition thereof so that an axis of easy magnetization of the thin magnetic films disposed adjacent to the antiferromagnetic film is perpendicular to an axis of easy magnetization of the other thin magnetic films. As an alternative, the magnetoresistance effects film is manufactured also by rotating a substrate on which the magnetoresistance effects film is formed by 90 degrees in place of rotating a magnetic field applied thereto.

It is preferable that the thin magnetic films have a thickness of 200 angstroms or smaller. On the other hand, the thin magnetic film does not have a lower limit with respect to a thickness thereof. However, if the thickness is below 30 angstroms, the surface scattering effect of conductive electrons are increased, and hence a change in magnetoresistance is reduced. If the thickness is equal to or greater than 30 angstroms, it is easy to keep the film thickness to be uniform, and hence the characteristics can be enhanced. In addition, the magnitude of saturated magnetization does not become too small.

It is possible to decrease the coercivity of the thin magnetic film disposed adjacent to the thin antiferromagnetic film by successively depositing the thin magnetic film with the thin antiferromagnetic film with a substrate temperature being maintained in the range of 150 to 300 degrees centigrade.

An interfacial film composed of Co or Co family alloy may be disposed between the thin magnetic films and the thin nonmagnetic films. Such an interfacial film increases the interface scattering probability of conductive electrons, and thus provides a larger change in resistance. The lower limit of a thickness of the interfacial film to be added is 5 angstroms. If a thickness of the interfacial film is below 5 angstroms, the advantageous effects obtained by addition of the interfacial film is decreased, and further it is difficult to control a thickness of the interfacial film. There is no upper limit with respect to a thickness of the interfacial film, but it is preferable for the film to have a thickness of about 30 angstroms. If a film thickness is greater than 30 angstroms, there appears the hysteresis in outputs in operating ranges of the magnetoresistance effects element.

In the magnetoresistance effects film in accordance with the present invention, another thin antiferromagnetic film or permanent magnet film may be disposed adjacent to the magnetic layer which detects an external magnetic field, namely the magnetic layer disposed not adjacent to the originally disposed thin antiferromagnetic film or the thin permanent magnet film, in a direction of easy magnetization of the magnetic layer. This arrangement stabilizes magnetic domains, and hence avoids nonlinear outputs such as Barkhausen jump which would occur due to discontinuous displacement of magnetic domain walls. The thin antiferromagnetic film to be used for stabilizing magnetic domains may be composed of, for instance, FeMn, NiMn, NiO, CoO, FeO, $Fe_2O_3$, CrO or MnO. The thin permanent magnet film to be used for stabilizing magnetic domains may be preferably composed of, for instance, CoCr, CoCrTa, CoCrTaPt, CoCrPt, CoNiPt, CoNiCr, CoCrPtSi or FeCoCr. In addition, an underlying layer may be disposed beneath the thin permanent magnet film. Such an underlying layer may be composed of chromium (Cr).

The thin nonmagnetic film plays a role of weakening magnetic interaction among the thin magnetic films, and is not to be limited to any particular material. The thin nonmagnetic film may be composed of metal nonmagnetic substance, semimetal nonmagnetic substance or nonmetal nonmagnetic substance. The metal nonmagnetic substance is preferably selected from, for instance, Au, Ag, Cu, Pt, Al, Mg, Mo, Zn, Nb, Ta, V, Hf, Sb, Zr, Ga, Ti, Sn, Pb or an alloy of these metals. The semimetal nonmagnetic substance is preferably selected from $SiO_2$, SiO, SiN, $Al_2O_3$, ZnO, MgO, TiN or any one of those compounds into which another element is added.

In view of the experimental results, it is preferable for the thin nonmagnetic film to have a thickness in the range of 20 to 40 angstroms. In general, if the thickness is over 40 angstroms, the spin-dependent scattering effect becomes relatively small, because a resistance of the magnetoresistance effects film is dependent on the thin nonmagnetic film. As a result, a rate of change in magnetoresistance is forced to be small. On the other hand, if the film thickness is below 20 angstroms, the magnetic interaction among the thin magnetic films becomes too great, and in addition, it is impossible to avoid occurrence of magnetic direct contact, namely, a pin hole. Thus, it becomes quite difficult for magnetization orientations of the thin magnetic films to be antiparallel to each other.

A thickness of the thin magnetic film and the thin nonmagnetic film can be measured by means of a transmission type electron microscope, a scanning type electron microscope or Auger electron spectroscopic analysis and so on. The crystal structure of the thin film can be confirmed by means of X-ray diffraction or high energy electron diffraction and so on.

In the magnetoresistance effects film in accordance with the present invention, the number N of repeat of deposition of an artificial lattice film is not to be limited, and may be determined in dependence on an intended rate of change in magnetoresistance and the like. Herein, the term "an artificial lattice film" means a multi-film structure including at least an arrangement composed of an antiferromagnetic film or a permanent magnet film/a magnetic film/a nonmagnetic film/a magnetic film. However, when a thin antiferromagnetic film composed of oxide is to be used, it is preferable to adopt a structure composed of an antiferromagnetic layer/a magnetic layer/a nonmagnetic layer/a magnetic layer/a nonmagnetic layer/a magnetic layer/an antiferromagnetic layer, because the oxide antiferromagnetic film has a great resistivity which would deteriorate advantageous effects obtained by a multilayered structure.

As mentioned just above, the magnetoresistance effects film in accordance with the invention may further include a second thin antiferromagnetic film or a second thin permanent magnet film disposed adjacent to the other of the thin magnetic films which is remote from the thin antiferromagnetic film or thin permanent magnet film, respectively. The second thin antiferromagnetic film or permanent magnet film may be composed of two segments disposed on opposite ends of the thin magnetic film. The detailed structure will be described with reference to FIG. 1.

At an upper surface of the uppermost thin magnetic layer may be deposited a layer such as silicon nitride ($Si_3N_4$), silicon dioxide ($SiO_2$) and aluminum oxide ($Al_2O_3$) for preventing oxidation of the magnetoresistance effects film. A metallic conductive layer may also be deposited for an electrode to be connected thereto.

Since it is not possible to directly measure the magnetic characteristics of the thin magnetic films disposed in the magnetoresistance effects element, it is measured in general as follows. First, thin magnetic films to be measured are deposited with thin nonmagnetic films being interposed therebetween so that a total thickness of the thin magnetic films is in the range of 500 to 1000 angstroms. The thus fabricated deposited-films structure is used as a sample for measurement. The magnetic characteristics are measured with respect to the sample. In the deposited-films structure as a sample, a thickness of the thin magnetic films, a thickness of the thin nonmagnetic films and composition of these films are all the same as those of the magnetoresistance effects element.

In the magnetoresistance effects film in accordance with the present invention, it is absolutely necessary to dispose a thin antiferromagnetic film or a thin permanent magnet film adjacent to one of the thin magnetic films to thereby induce exchange anisotropy. This is based on the principle of the invention that a maximum resistance can be obtained when adjacent magnetic films have magnetization orientations directed oppositely to each other. In other words, in the magnetoresistance effects film in accordance with the invention, as shown with the B-H curve illustrated in FIG. 3, when an external magnetic field H is greater than an anisotropic magnetic field $H_{k2}$ of a thin magnetic film, but smaller than an exchange bias field Hr or $H_{ch}$ of other magnetic film, namely a magnetic film disposed adjacent to an antiferromagnetic film or a permanent magnet film ($H_{k2}$<H<Hr or $H_{ch}$), the adjacent magnetic films have oppositely directed magnetization orientations, thereby a resistance being increased.

Figure 2:
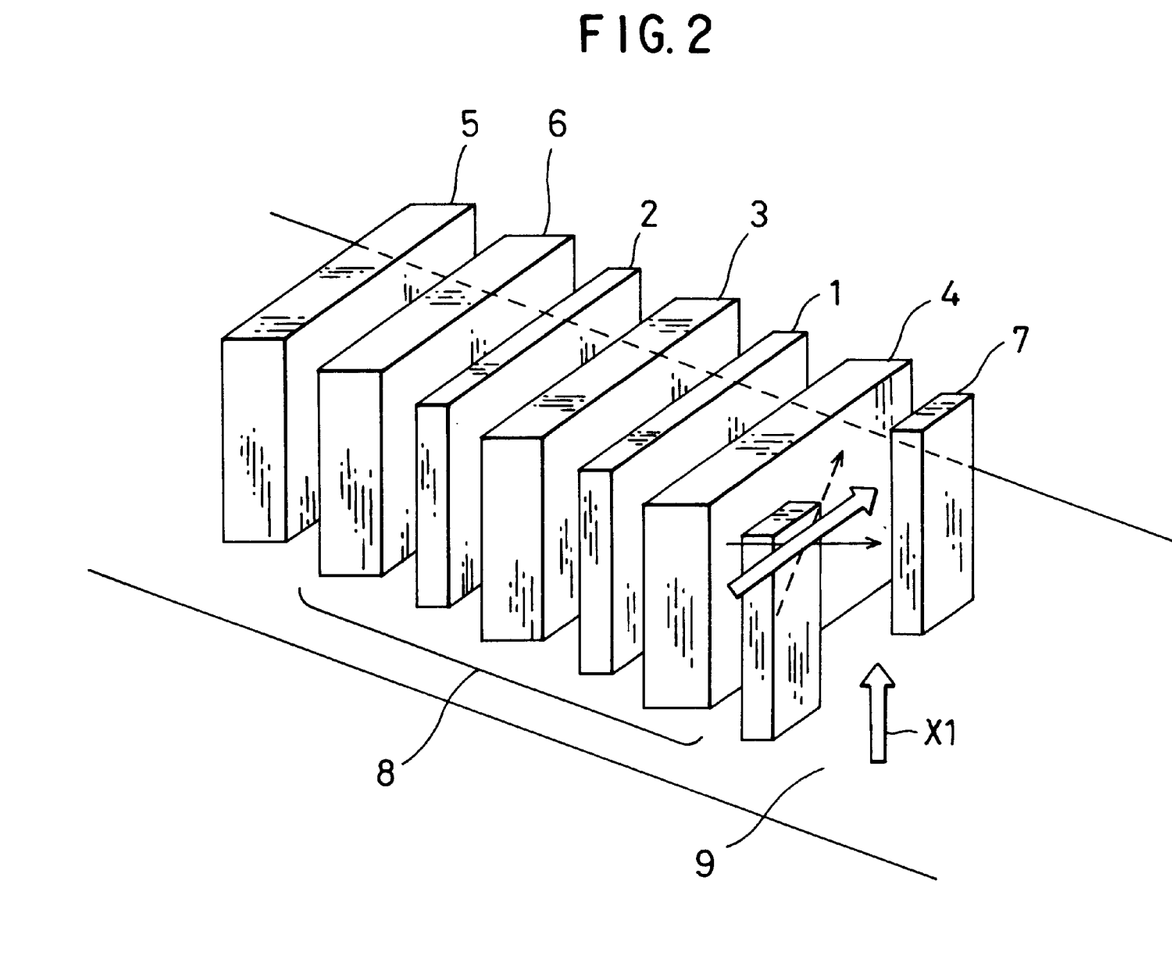
FIG. 2 is an exploded perspective view illustrating an example of a MR sensor including the magnetoresistance effects film in accordance with the present invention.

FIG. 2 is an exploded perspective view illustrating an example of a MR sensor including the magnetoresistance effects film in accordance with the present invention. As illustrated in FIG. 2, the MR sensor comprises an artificial lattice film 8 including a thin antiferromagnetic film or a thin permanent magnet film 6, a thin bcc-structured Fe film 2, a thin magnetic film 3, a thin nonmagnetic film 1, a thin magnetic film 4 and a second thin antiferromagnetic film or permanent magnet film 7 deposited on a substrate 5 in this order. Axes of easy magnetization of the thin magnetic films 3 and 4 between which the thin nonmagnetic film 1 is interposed are arranged to be perpendicular to each other. The second thin antiferromagnetic film or permanent magnet film 7 is adjacent to the thin magnetic film 4. In addition, a signal field X1 derived from a magnetic record medium 9 is arranged to be perpendicular to the axis of easy magnetization of the thin magnetic film 4.

In this arrangement, the thin magnetic film 3 is imparted unidirectional anisotropy by the thin antiferromagnetic film or permanent magnet film 6 disposed adjacent thereto via the bcc-structured Fe film 2. In the vicinity of opposite ends of the thin magnetic film 4 is disposed adjacent thereto the second thin antiferromagnetic film or permanent magnet film 7 in a direction of an axis of easy magnetization of the thin magnetic film 4, and the second thin antiferromagnetic film or permanent magnet film 7 is unidirectionally oriented in a direction of an axis of easy magnetization of the thin magnetic film 4. The magnetization orientation of the thin magnetic film 4 is rotated in dependence on the magnitude of a signal field of the magnetic record medium 9. With the rotation of the magnetization orientation of the thin magnetic film 4, a resistance is varied and hence it is now possible to detect a magnetic field.

Figure 3:
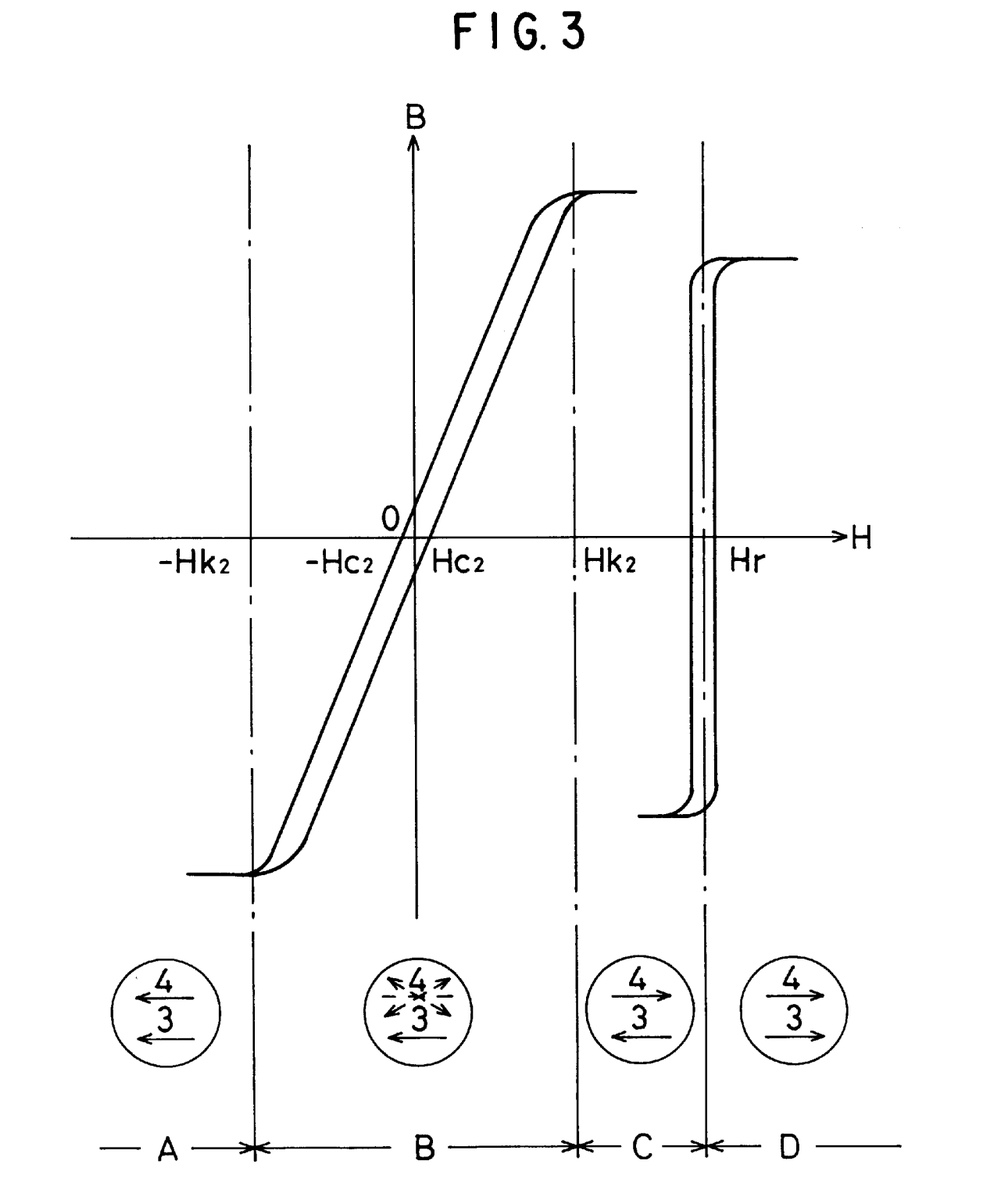
FIG. 3 illustrates the B-H curve for explaining the principle of the magnetoresistance effects film in accordance with the present invention.

Hereinbelow will be explained the relationship among an external magnetic field, a coercivity and magnetization orientation in the magnetoresistance effects film in accordance with the present invention with reference to FIG. 3.

1. As illustrated in FIG. 3, an exchange anisotropy field of the exchange biased thin soft magnetic film is represented with Hr, a coercivity of the other thin soft magnetic film is represented with $H_{c2}$, and an anisotropic magnetic field is represented with $H_{k2}$ in the magnetoresistance effects film in accordance with the present invention. The relation among them is defined by the equation: $0<H_{k2}<Hr$. First, an external magnetic field having an intensity of H is applied to the magnetoresistance effects film so that the equation $H<-H_{k2}$ is established. In this stage, the magnetization orientations of the thin magnetic films 3 are directed in a negative direction in the same way as that of the external magnetic field H. This state is shown as a region A in FIG. 3

2. Then, as the external magnetic field is being weakened, the magnetization of the thin magnetic film 4 beings to rotate in a positive direction when the intensity of the external field H is greater than $-H_{k2}$, but smaller than $H_{k2}$ ($-H_{k2}<H<H_{k2}$). This state is shown as a region B in FIG. 3

3. When the intensity H of the external magnetic field is greater than $H_{k2}$, but smaller than Hr ($H_{k2}<H<Hr$), the magnetization orientations of the thin magnetic films 3 and 4 are opposite to each other. Namely, the magnetization of the thin magnetic film 3 is in a negative direction, while the magnetization of the thin magnetic film 4 is in a positive direction. This state is shown as a region C in FIG. 3

4. When the intensity H of the external magnetic field is increased beyond Hr (H>Hr), the magnetization of the thin magnetic film 3 is also inverted, and thus the magnetization orientation of the thin magnetic film 3 becomes the same as that of the thin magnetic film 4 in a positive direction. This state is shown as a region D in FIG. 3.

Figure 4:
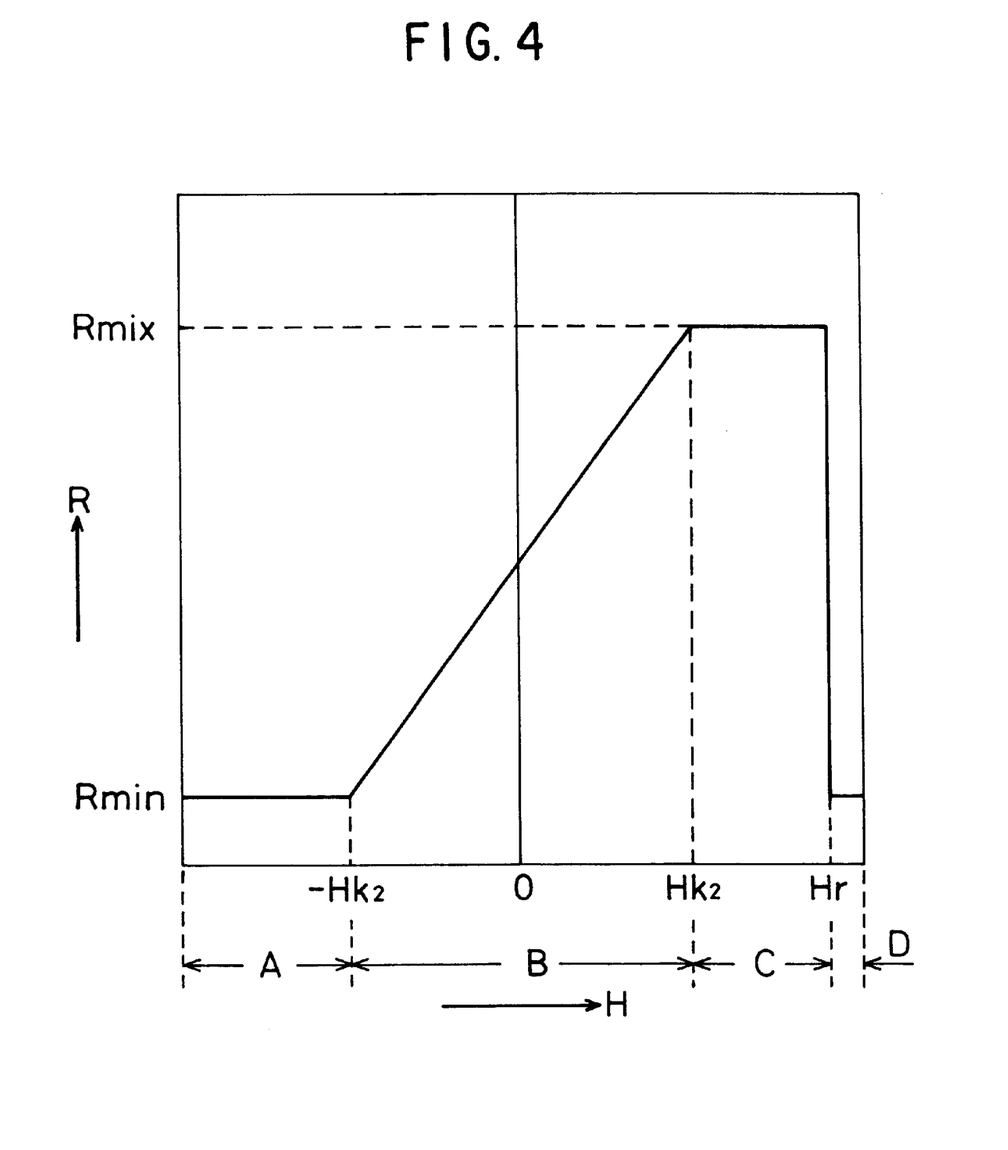
FIG. 4 illustrates the R-H curve for explaining the principle of the magnetoresistance effects film in accordance with the present invention.

As understood in view of the R-H curve illustrated in FIG. 4, a resistance value of the magnetoresistance effects film varies in dependence on relative magnetization orientations between the thin magnetic films 3 and 4. Specifically, the resistance value linearly varies in the vicinity of zero field in the region B, reaches and maintains a maximum value Rmax in the region C, and takes a minimum value Rmin in the regions A and D.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

Figure 1:
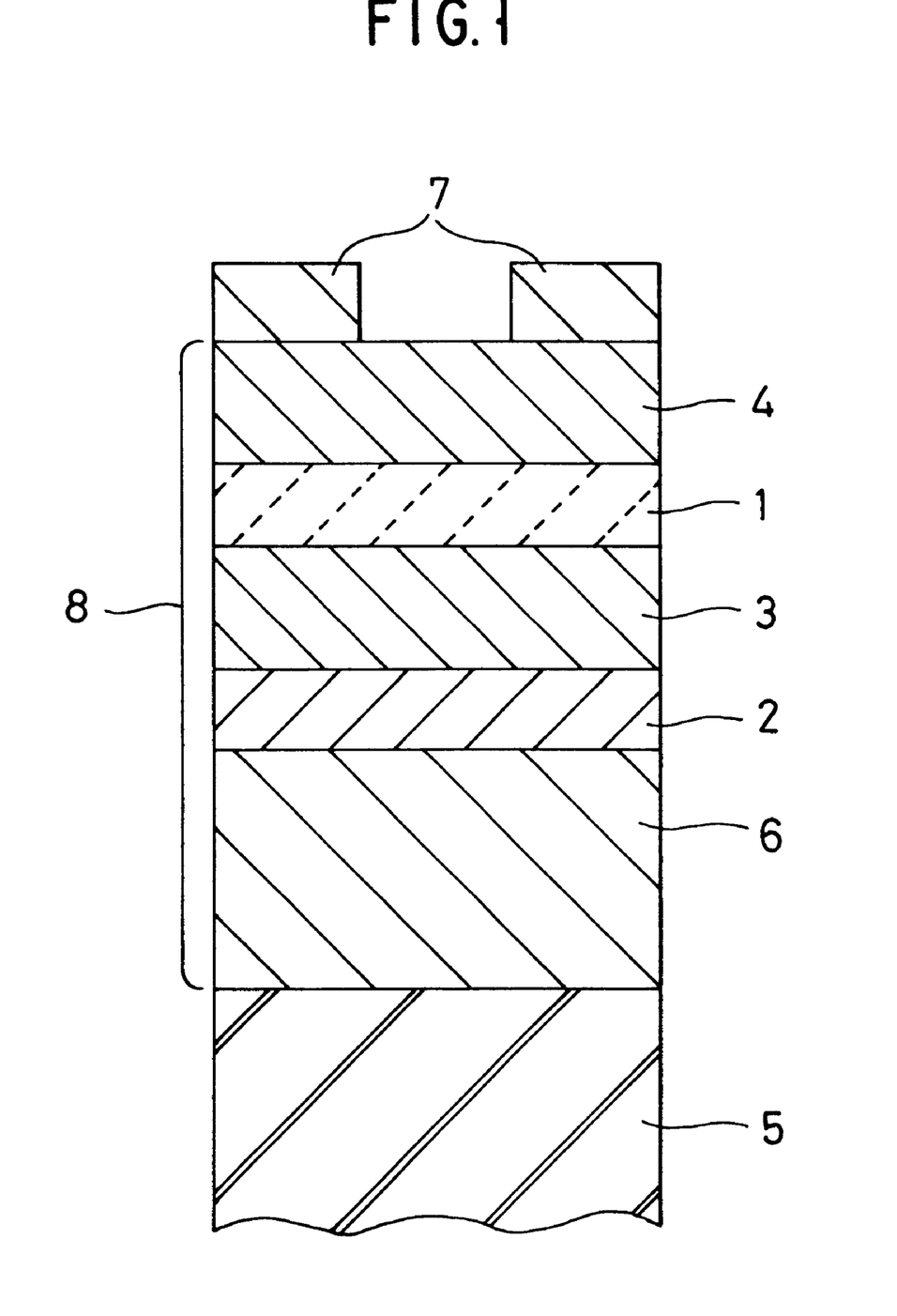
FIG. 1 is a side cross-sectional view illustrating the magnetoresistance effects film in accordance with the first embodiment of the invention.

FIG. 1 illustrates a magnetoresistance effects film in accordance with the first embodiment of the present invention. As illustrated, the magnetoresistance effects film in accordance with the first embodiment comprises an artificial lattice film 8 formed on a substrate 5. Herein, the artificial lattice film 8 includes a thin antiferromagnetic film or permanent magnet film 6, a thin bcc-structured Fe film 2, a thin magnetic film 3, a thin nonmagnetic film 1, and a thin magnetic film 4 deposited in this order on the substrate 5. The second thin antiferromagnetic film or permanent magnet film 7 is composed of two segments disposed on opposite ends of the thin magnetic film 4. An interfacial film 7 composed of Co or Co family alloy may be disposed between the thin magnetic film 3 and the thin nonmagnetic film 1.

Hereinbelow will be explained the results of the experiment having been carried out about the magnetoresistance effects film made in accordance with the invention.

First, there was prepared a substrate made of glass. The glass substrate was put in a vacuum chamber, and the vacuum chamber was made vacuous in the order of $10^{-7}$Torr. Then, a temperature of the glass substrate was raised to 150 degrees centigrade. Subsequently, a thin antiferromagnetic film having a thickness of 500 angstroms was formed on the glass substrate, and a bcc-structured Fe film and a magnetic film made of NiFe were successively deposited on the antiferromagnetic film. Thus, an exchange biased film was formed at 150 degrees centigrade, and thereafter the temperature of the glass substrate was lowered to room temperature. Then, thin magnetic films and a thin nonmagnetic film were deposited to thereby form a magnetoresistance effects film.

The measurement of the magnetization of the magnetoresistance effects film including an artificial lattice therein was carried out by means of a vibrating sample magnetometer. In the measurement of magnetoresistance, a $1.0\times10$ mm$^2$ sample was prepared from a specimen. While an external magnetic field was applied to a plane of the sample so that the field was perpendicular to a current, the external magnetic filed was varied in the range of −500 to 500 Oe. The magnetoresistance was measured during the variation of the magnetic field by using a standard four-points contact method. Based on the measured resistance, a rate of change in magnetoresistance $\Delta R/R$ was obtained. The rate of change in magnetoresistance $\Delta R/R$ was calculated by the following equation wherein the maximum resistance is represented with Rmax and the minimum resistance is represented with Rmin.

$\Delta R/R = [(R_{max} - R_{min})/R_{min}] \times 100 [\%]$

Then, the following artificial lattice film was deposited at a deposition rate in the range of approximately 2.2 to approximately 3.5 angstroms per second.

Glass/(CoO(10)/NiO(10))$_{25}$/Fe(50)/NiFe(50) /Cu(25)/ NiFe(100)

The above mentioned artificial lattice film comprises (a) a glass substrate, (b) an antiferromagnetic superlattice film composed of 10 angstrom CoO layers and 10 angstrom NiO layers in turn deposited 25 times, (c) a bcc Fe layer having a thickness of 50 angstroms, (d) a magnetic layer composed of Ni 80%–Fe 20% and having a thickness of 50 angstroms, (e) a nonmagnetic layer composed of Cu and having a thickness of 25 angstroms, and (f) a magnetic layer composed of Ni 80%–Fe 20% and having a thickness of 100 angstroms, (b) to (f) being successively deposited on the glass substrate in this order.

The artificial lattice film provides approximately 3.8% of a rate of change in magnetoresistance by designing a thickness of the nonmagnetic layer to be 25 angstroms and lowers hysteresis by adding the bcc-structured Fe layer as a underlying layer to be disposed beneath a magnetic sandwiched structure comprising a magnetic layer/a nonmagnetic layer/a magnetic layer. In addition, 6% of a rate of change in magnetoresistance could be obtained by interposing a Co layer between the magnetic NiFe layer and the nonmagnetic Cu layer.

Figure 5:
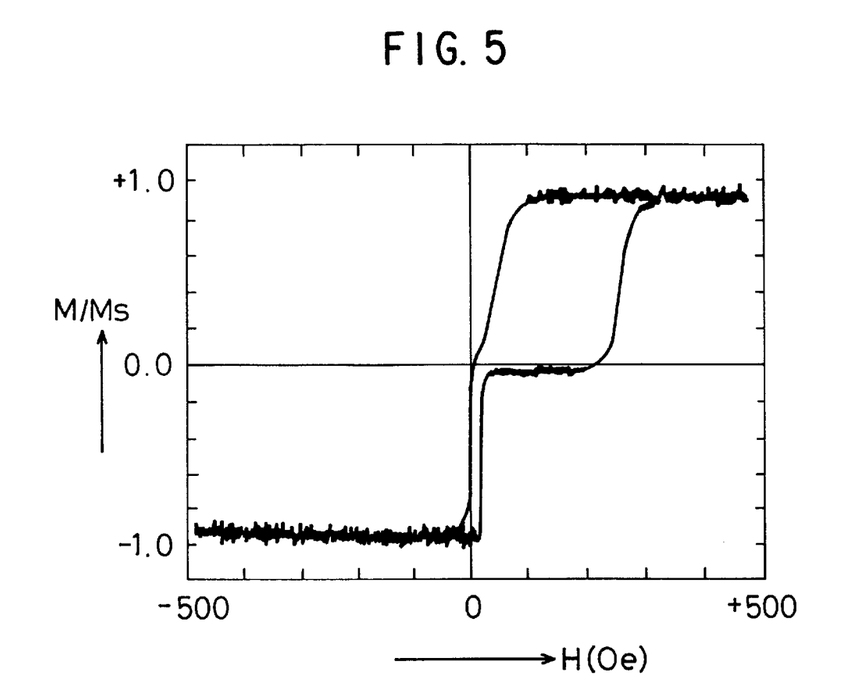
FIG. 5 illustrates the B-H curve of the magnetoresistance effects film in accordance with the present invention.
Figure 6:
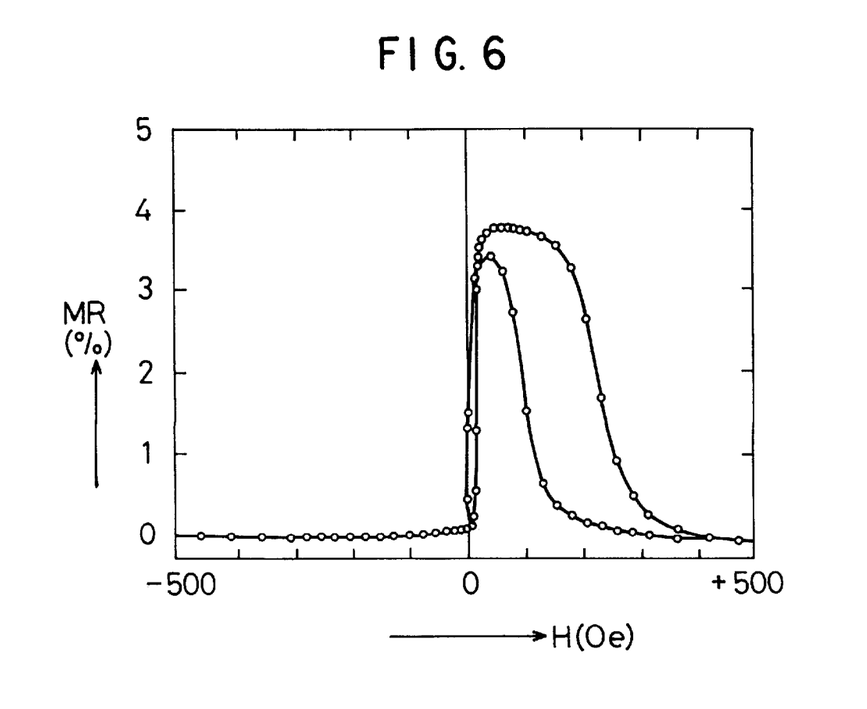
FIG. 6 illustrates the MR curve of the magnetoresistance effects film in accordance with the present invention.

FIG. 5 illustrates the B-H curve having been obtained when the external magnetic field was varied in the range of −500 to 500 Oe with respect to the magnetoresistance effects film made in accordance with the embodiment. FIG. 6 illustrates the MR curve which indicates a change rate in the magnetoresistance. FIGS. 5 and 6 show that large linear change in the magnetoresistance occurred at approximately zero field.

Though in the embodiment is set forth a case wherein the thin antiferromagnetic film comprises a superlattice composed of CoO and NiO, approximately 4 to 7% of a rate of change in the magnetoresistance could be obtained, even if one of the following superlattices (a) to (d) was used in place of the superlattice used in the above mentioned embodiment: (a) a superlattice composed of $Ni_xCo_{1-x}O(x=0.1–0.9)$ and NiO, (b) a superlattice composed of $Ni_xCo_{1-x}O(x=0.1–0.9)$ and CoO, (c) a superlattice composed of NiO, CoO, FeO, $Fe_2O_3$, CrO, MnO or Cr, and (d) a superlattice composed of mixture of compounds listed in (c). As an alternative, approximately 4 to 7% of a rate of change in the magnetoresistance could be obtained also by substituting a permanent magnet film composed of one of the followings (a) to (h) for the thin antiferromagnetic film: (a) CoCr, (b) CoCrTa, (c) CoCrTaPt, (d) CoCrPt, (e) CoNiPt, (f) CoNiCr, (g) CoCrPtSi, and (h) FeCoCr.

As having been described with reference to the preferred embodiment, the present invention provides a magnetoresistance effects film which exhibits great linear changes in magnetoresistance even by a small external magnetic field with hysteresis being small.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A magnetoresistance effects film comprising:
   first and second magnetic thin films deposited on a substrate;
   at least one nonmagnetic thin film interposed between said first and second magnetic thin films; and
   a permanent magnet thin film disposed adjacent to said first magnetic thin film,
   a bias magnetic field of said first magnetic thin film induced by said permanent magnet thin film having an intensity $H_{ch}$ which is greater than a coercivity $H_{c2}$ of said second magnetic thin film ($H_{ch} > H_{c2}$), and
   said permanent magnet thin film comprising one of CoCr, CoCrTa, CoCrTaPt, CoCrPt, CoNiPt, CoNiCr, CoCrPtSi and FeCoCr.

2. The magnetoresistance effects film as set forth in claim 1 further comprising a bcc-structured Fe layer having a thickness ranging from 10 to 60 angstroms both inclusive, said bcc-structured Fe layer disposed between said permanent magnet film and said first magnetic thin film.

3. The magnetoresistance effects film as set forth in claim 1 further comprising an underlying layer disposed between said permanent magnet thin film and said substrate, said underlying layer comprising chromium (Cr).

4. The magnetoresistance effects film as set forth in claim 1 further comprising a second permanent magnet thin film disposed adjacent to said second magnetic film.

5. The magnetoresistance effects film as set forth in claim 4, wherein said second permanent magnet thin film comprises two separate segments disposed on opposite ends of said second magnetic thin film.

6. The magnetoresistance effects film as set forth in claim 1 further comprising a antiferromagnetic thin film disposed adjacent to said second magnetic thin film.

7. The magnetoresistance effects film as set forth in claim 6, wherein said antiferromagnetic thin film comprises two separate segments disposed on opposite ends of said second magnetic film.

8. The magnetoresistance effects film as set forth in claim 1 wherein said magnetoresistance effects film is manufactured by rotating a magnetic field applied thereto by 90 degrees while said magnetoresistance effects film is being manufactured so that an axis of easy magnetization of said first magnetic thin film is perpendicular to an axis of easy magnetization of said second magnetic thin film.

9. The magnetoresistance effects film as set forth in claim 1, wherein said magnetoresistance effects film is manufactured by rotating a substrate on which said magnetoresistance effects film is formed by 90 degrees in magnetic field so that an axis of easy magnetization of said first magnetic thin film is perpendicular to an axis of easy magnetization of said second magnetic thin film.

10. The magnetoresistance effects film as set forth in claim 1, wherein said first and second magnetic thin films have a thickness in the range of 30 to 200 angstroms both inclusive.

11. The magnetoresistance effects film as set forth in claim 1 further comprising an interfacial film comprising one of Co and Co family alloy, said layer being disposed between said first and second magnetic thin films and said nonmagnetic thin film.

12. The magnetoresistance effects film as set forth in claim 11, said interfacial film has a thickness in the range of 5 to 30 angstroms both inclusive.

13. The magnetoresistance effects as set forth in claim 1, wherein said nonmagnetic thin film has a thickness in the range of 20 to 40 angstroms both inclusive.

* * * * *

UNITED STATES PATENT AND TRADEMARK OFFICE
CERTIFICATE OF CORRECTION

| | |
|---|---|
| PATENT NO. | : 6,063,491 |
| DATED | : May 16, 2000 |
| INVENTOR(S) | : Jun-Ichi Fujikata et al. |

It is certified that error appears in the above-identified patent and that said Letters Patent is hereby corrected as shown below:

In Item No. [30], Foreign Application Priority Data, change "Jan. 27, 1996 [JP] ................7-13354" to -- Jan. 27, 1995 {JP} ............. 7-11354--.

Signed and Sealed this

Twenty-eighth Day of August, 2001

Attest:

*Nicholas P. Godici*

NICHOLAS P. GODICI
*Acting Director of the United States Patent and Trademark Office*

*Attesting Officer*